US 11,892,282 B2

(12) United States Patent
Yoshida et al.

(10) Patent No.: US 11,892,282 B2
(45) Date of Patent: Feb. 6, 2024

(54) PROTECTIVE FILM THICKNESS MEASURING METHOD

(71) Applicant: DISCO CORPORATION, Tokyo (JP)

(72) Inventors: Hiroto Yoshida, Tokyo (JP); Nobuyasu Kitahara, Tokyo (JP); Kuo Wei Wu, Tokyo (JP); Kunimitsu Takahashi, Tokyo (JP); Naoki Murazawa, Tokyo (JP); Joel Koerwer, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/663,490

(22) Filed: May 16, 2022

(65) Prior Publication Data

US 2022/0373321 A1  Nov. 24, 2022

(30) Foreign Application Priority Data

May 20, 2021 (JP) .................. 2021-085221

(51) Int. Cl.
*G01B 11/06* (2006.01)
(52) U.S. Cl.
CPC ............... *G01B 11/0625* (2013.01)
(58) Field of Classification Search
CPC ................................ G01B 11/0625
USPC ........................................ 356/630
See application file for complete search history.

(56) References Cited

U.S. PATENT DOCUMENTS

| 4,377,869 A | * | 3/1983 | Venalainen | ........... G01N 23/223 378/50 |
| 2010/0296092 A1 | * | 11/2010 | Cho | ............ G01N 21/211 356/369 |
| 2017/0176331 A1 | * | 6/2017 | Ryo | ............ G01N 21/8422 |
| 2017/0368636 A1 | * | 12/2017 | Ryo | ............ H01L 22/12 |
| 2021/0293531 A1 | * | 9/2021 | Umehara | ........... G01B 11/0625 |

FOREIGN PATENT DOCUMENTS

JP          2017112296 A     6/2017

* cited by examiner

*Primary Examiner* — Michael A Lyons
*Assistant Examiner* — Omar H Nixon
(74) *Attorney, Agent, or Firm* — GREER BURNS & CRAIN, LTD

(57) ABSTRACT

A protective film thickness measuring method includes a step of applying light to a top surface of a wafer in a state in which no protective film is formed and measuring a first reflection intensity of the light reflected from the top surface, a step of forming the protective film including a light absorbing material, a step of irradiating the protective film with exciting light of a wavelength at which the light absorbing material fluoresces and measuring a second reflection intensity including fluorescence of the protective film and the light reflected from the top surface, and a step of excluding reflection intensity of patterns formed on the top surface, by subtracting the measured first reflection intensity from the measured second reflection intensity, and calculating fluorescence intensity of the protective film.

11 Claims, 5 Drawing Sheets

PROTECTIVE FILM THICKNESS MEASURING METHOD

BACKGROUND OF THE INVENTION

Field of the Invention

The present invention relates to a method of measuring the thickness of a protective film formed on a top surface of a wafer having patterns on the top surface.

Description of the Related Art

There is a case where a protective film is formed by a liquid resin or the like being applied to the top surface of a semiconductor wafer and the film thickness of the formed protective film is desired to be measured. For example, as conventionally disclosed in Japanese Patent Laid-Open No. 2017-112296, there has been proposed a method which measures the thickness of the protective film by irradiating the protective film including a light absorbing material with light and measuring the intensity of fluorescence emitted from the protective film when the light absorbing material absorbs the light. Further, there has been proposed a method which records a relation between the fluorescence intensity and the film thickness in advance, and measures the film thickness in reference to the obtained intensity of the fluorescence.

SUMMARY OF THE INVENTION

However, in a case where device patterns having reflectance different from the rest depending on positions are formed on the top surface of the semiconductor wafer and a protective film is formed on the top surface on which the patterns are formed, the measured fluorescence intensity is a sum total of the fluorescence of the protective film and the light reflected by pattern surfaces. There is thus a problem of being unable to measure the film thickness accurately.

It is accordingly an object of the present invention to provide a protective film thickness measuring method that can accurately measure the thickness of a protective film in a case of measuring the thickness of the protective film formed on the top surface of a wafer having patterns on the top surface.

In accordance with an aspect of the present invention, there is provided a protective film thickness measuring method for measuring a thickness of a protective film formed on a top surface of a wafer having patterns on the top surface, the protective film thickness measuring method including a pre-protective film formation measuring step of applying light to the top surface of the wafer in a state in which no protective film is formed and measuring a first reflection intensity of the light reflected from the top surface, a protective film forming step of forming the protective film including a light absorbing material on the top surface, a post-protective film formation measuring step of irradiating the protective film with exciting light of a wavelength at which the light absorbing material fluoresces and measuring a second reflection intensity including fluorescence of the protective film and the light reflected from the top surface by a measuring unit, a protective film fluorescence intensity calculating step of excluding a reflection intensity of the patterns formed on the top surface, by subtracting the first reflection intensity measured in the pre-protective film formation measuring step from the second reflection intensity measured in the post-protective film formation measuring step, and calculating a fluorescence intensity of the protective film, and a protective film thickness identifying step of identifying the thickness of the protective film from correlation data regarding correlation between the fluorescence intensity of the protective film and the thickness of the protective film, the correlation data being obtained in advance, and the calculated fluorescence intensity of the protective film.

Preferably, the measuring unit can function as an imaging unit, the pre-protective film formation measuring step images the top surface of the wafer by the imaging unit, the post-protective film formation measuring step images a top surface of the protective film formed on the top surface of the wafer by the imaging unit, and the first reflection intensity and the second reflection intensity are respectively measured in reference to luminance of pixels of respective images obtained by the imaging unit.

Preferably, a light source that irradiates the top surface of the wafer with light in the pre-protective film formation measuring step and the post-protective film formation measuring step is a white light source, and a first filter that transmits only light of a specific wavelength is disposed between the light source and the wafer.

Preferably, the light source that irradiates the top surface of the wafer with light in the pre-protective film formation measuring step and the post-protective film formation measuring step is a white light source, and a second filter that transmits only light of a specific wavelength is disposed between the wafer and the measuring unit.

According to the present invention, it is possible to accurately measure the thickness of the protective film formed on the top surface of the wafer having the patterns on the top surface.

In addition, the measuring unit can function as an imaging unit, the pre-protective film formation measuring step images the top surface of the wafer by the imaging unit, the post-protective film formation measuring step images the top surface of the protective film formed on the top surface of the wafer by the imaging unit, and the first reflection intensity and the second reflection intensity are respectively measured in reference to the luminance of the pixels of the respective images obtained by the imaging unit. It is thereby possible to make a measurement time shorter than that of a point measurement using a sensor as in related art.

Further, the light source that irradiates the top surface of the wafer with light in the pre-protective film formation measuring step and the post-protective film formation measuring step is a white light source. The light source can thus emit light of a plurality of wavelengths. In addition, the first filter that transmits only light of a specific wavelength is disposed between the light source and the wafer. It is thus possible to irradiate the protective film with only light of a desired wavelength from the light to be applied (light of the plurality of wavelengths) according to the kind of the protective film or the light absorbing material or the like.

Further, the light source that irradiates the top surface of the wafer with light in the pre-protective film formation measuring step and the post-protective film formation measuring step is a white light source, and the second filter that transmits only light of a specific wavelength is disposed between the wafer and the measuring unit. Thus, in the post-protective film formation measuring step, the light applied from the light source is prevented from being made incident on the measuring unit.

The above and other objects, features and advantages of the present invention and the manner of realizing them will become more apparent, and the invention itself will best be

DETAILED DESCRIPTION OF THE PREFERRED EMBODIMENT

Figure 1:
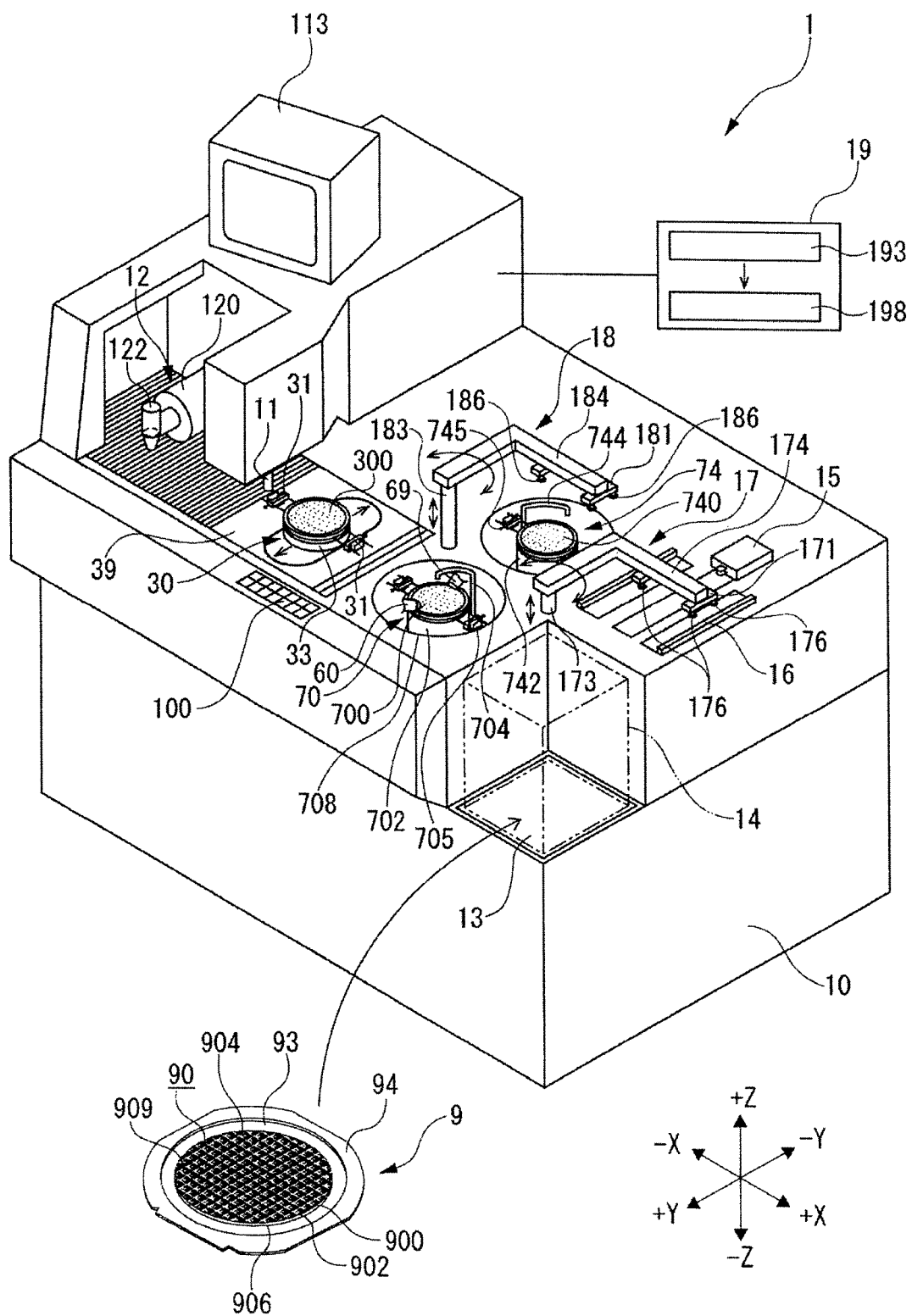
FIG. 1 is a perspective view illustrating an example of a laser processing apparatus that can perform protective film thickness measurement.

A processing apparatus 1 illustrated in FIG. 1 is an apparatus that subjects a wafer 90 held under suction on a chuck table 30 to laser processing by a laser irradiating unit 12. A region on an +X direction side on an apparatus base 10 having an X-axis direction of the laser processing apparatus 1 as a longitudinal direction is a mounting and demounting region in which the wafer 90 is mounted and demounted onto and from the chuck table 30. A region on a −X direction side on the apparatus base 10 is a processing region in which the laser processing of the wafer 90 held under suction on the chuck table 30 is performed by the laser irradiating unit 12. It is to be noted that the processing apparatus 1 is not limited to a laser processing apparatus, and may be a cutting apparatus that can dice the wafer 90 by a cutting blade or the like.

Figure 2:
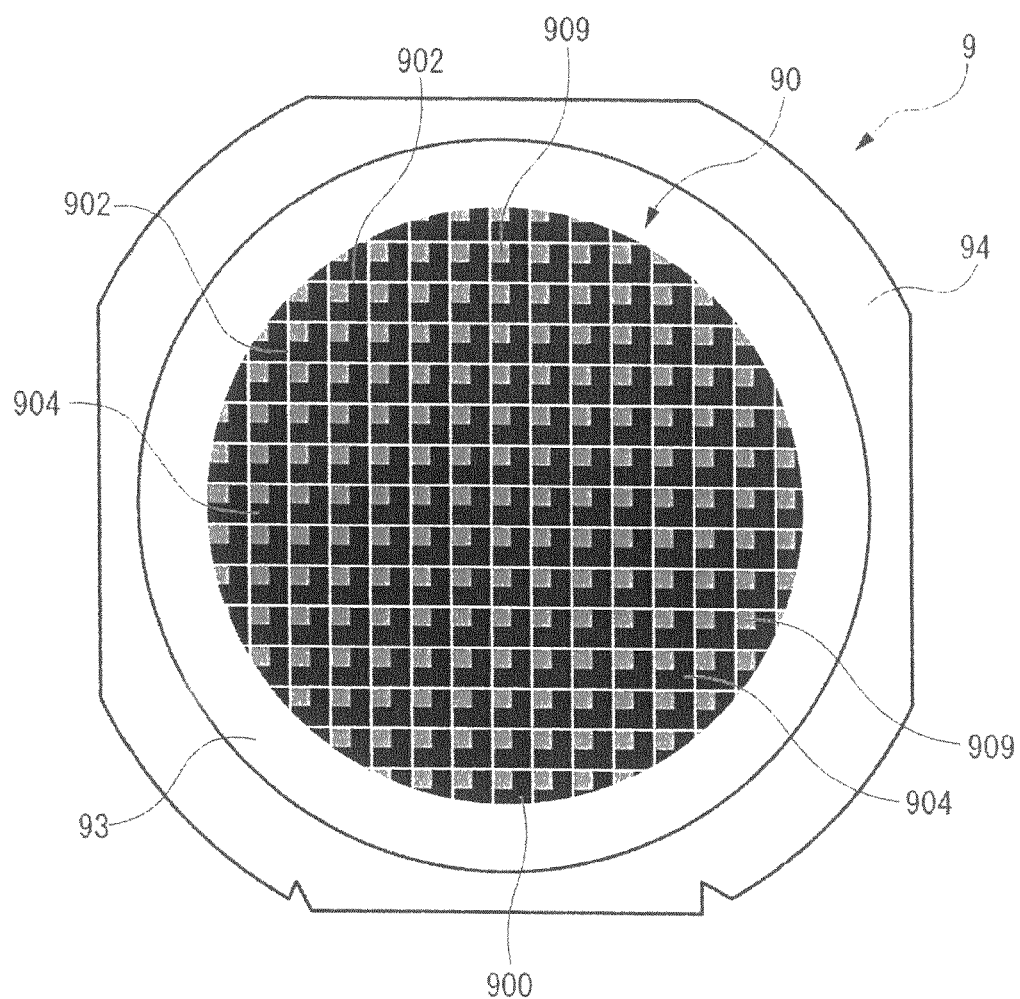
FIG. 2 is a plan view illustrating an example of the structure of a wafer in a frame unit.
Figure 2:
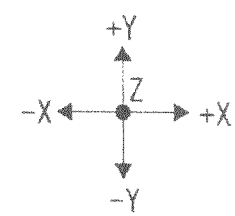

The wafer 90 illustrated in FIG. 1 and FIG. 2 is, for example, a circular silicon semiconductor wafer. On a top surface 900 of the wafer 90 which top surface is oriented upward, devices 904 are formed in grid-shaped regions demarcated by planned dividing lines 902. A predetermined pattern 909 is formed in the devices 904. It is to be noted that, while, in FIG. 1 and FIG. 2, the pattern 909 is schematically represented by a quadrangular shape formed at corners of the device 904, the shape is not limited to this. That is, the wafer 90 is a wafer having a device pattern on the top surface 900.

An undersurface 906 of the wafer 90 is, for example, affixed to an affixing surface (top surface) of a supporting tape 93. An outer circumferential portion of the supporting tape 93 is affixed to an annular frame 94. Thus, the wafer 90 is supported by the annular frame 94 via the supporting tape 93, and constitutes a frame unit 9 that can be handled by use of the annular frame 94. The center of the annular frame 94 and the center of the wafer 90 substantially coincide with each other. It is to be noted that the wafer 90 is not limited to the above-described example. The wafer 90 may not constitute the frame unit 9, and may be a wafer single body. The wafer 90 may be formed of, other than silicon, gallium arsenide, sapphire, gallium nitride, resin, ceramic, silicon carbide, or the like.

A front side (+Y direction side) of the apparatus base 10 is provided with an input unit 100 for an operator to input processing conditions or the like to the laser processing apparatus 1. As illustrated in FIG. 1, a cassette mounting base 13 is installed at one corner on the +Y direction side on the apparatus base 10. The cassette mounting base 13 can be moved up and down in a Z-axis direction by an unillustrated raising and lowering elevator which is disposed below the cassette mounting base 13. The raising and lowering elevator raises or lowers the cassette mounting base 13 in a state in which a cassette 14 housing a plurality of frame units 9 on internal shelves is mounted on the cassette mounting base 13. A height position at a time of extracting and inserting a target frame unit 9 from and into the cassette 14 is thereby adjusted.

In front of an unillustrated opening on a −Y direction side of the cassette 14 mounted on the cassette mounting base 13 illustrated in FIG. 1, for example, disposed is a push-pull 15 which extracts the frame unit 9 that has not yet been subjected to processing from the cassette 14 and inserts the frame unit 9 subjected to laser processing and cleaned into the cassette 14.

In a movable range of the push-pull 15 movable in a Y-axis direction, for example, disposed is a centering guide 16 which is formed by a pair of guide rails that position, to a certain position, the frame unit 9 extracted from the cassette 14 by the push-pull 15.

As illustrated in FIG. 1, the laser processing apparatus 1 includes a first transporting unit 17 that holds the frame unit 9 centered by the centering guide 16 and loads the frame unit 9 onto a coating table 700 of a protective film forming unit 70, or unloads the frame unit 9 from the coating table 700.

The first transporting unit 17 includes a holding pad 171 that holds, from above, the frame unit 9 held by the centering guide 16; and a moving mechanism 173 that vertically moves the holding pad 171 in the Z-axis direction (vertical direction) and swings the holding pad 171 in a horizontal plane (in an X-axis and Y-axis plane).

The holding pad 171 attached to the lower surface of a distal end of a swing arm 174 of the moving mechanism 173 is, for example, in an H-shape as viewed in plan. The holding pad 171 has, on a lower surface thereof, four suction disks 176 that suck the annular frame 94 supporting the wafer 90. Each of the suction disks 176 communicates with a suction source such as an unillustrated vacuum generating apparatus which generates a suction force.

The protective film forming unit 70 that forms a protective film on the top surface 900 of the wafer 90 and a cleaning unit 74 that cleans the frame unit 9 that has been subjected to laser processing are arranged in a region on the −X direction side of the arrangement position of the first transporting unit 17 on the apparatus base 10.

In addition, in the vicinity of the protective film forming unit 70 and the cleaning unit 74, disposed is a second transporting unit 18 which holds the frame unit 9 on which the protective film is formed by the protective film forming unit 70 and loads the frame unit 9 onto the chuck table 30, or unloads the frame unit 9 that has been subjected to laser processing from the chuck table 30 and transports the frame unit 9 to the cleaning unit 74.

The second transporting unit 18, for example, includes a holding pad 181 that holds, from above, the frame unit 9 held under suction by the chuck table 30; and a moving mechanism 183 that vertically moves the holding pad 181 in the Z-axis direction (vertical direction) and swings the holding pad 181 in the horizontal plane (in the X-axis and Y-axis plane).

The holding pad 181 attached to the lower surface of a distal end of a swing arm 184 of the moving mechanism 183 is, for example, in an H-shape as viewed in plan. The holding pad 181 has, on a lower surface thereof, four suction disks 186 that suck the annular frame 94 supporting the wafer 90. Each of the suction disks 186 communicates with a suction source such as an unillustrated vacuum generating apparatus which generates a suction force.

The protective film forming unit 70 illustrated in FIG. 1 includes at least the coating table 700 that is housed in a casing 708 and holds under suction the wafer 90; a rotating unit 702 that includes a motor and a rotary shaft or the like for rotating the coating table 700; a protective film agent applying nozzle 704 swingable above the coating table 700 at a predetermined angle; and a plurality of sandwiching clamps 705 that are arranged on the periphery of the coating table 700 at equal intervals in a circumferential direction and sandwich the annular frame 94.

The coating table 700 may, for example, be movable in an upward-downward direction by an unillustrated raising and lowering unit which is formed by an air cylinder or the like. The unillustrated raising and lowering unit raises the coating table 700 and positions the coating table 700 at a height position for loading and unloading the wafer 90, and lowers the coating table 700 in a state of holding the wafer 90 and positions the coating table 700 at a height position at a time of forming the protective film in the casing 708.

The cleaning unit 74 illustrated in FIG. 1 includes at least a spinner table 740 that holds under suction the wafer 90; a rotating unit 742 that rotates the spinner table 740; a cleaning nozzle 744 swingable above the spinner table 740 at a predetermined angle; and a plurality of sandwiching clamps 745 that are arranged on the periphery of the spinner table 740 at equal intervals in the circumferential direction and sandwich the annular frame 94.

The chuck table 30 having a circular shape as viewed in plan, for example, has a flat holding surface 300 formed by a porous member or the like. The holding surface 300 communicates with an unillustrated suction source such as a vacuum generating apparatus or an ejector mechanism. In addition, clamps 31 that sandwich and fix the annular frame 94 are arranged on the periphery of the chuck table 30 at equal intervals in a circumferential direction.

As illustrated in FIG. 1, the chuck table 30 can be rotated with a Z-axis as a rotational axis by a table rotating mechanism 33 coupled to a lower surface side of the chuck table 30, while the chuck table 30 is surrounded from the periphery by a cover 39. In addition, the chuck table 30 can be reciprocated in the X-axis direction as a processing feed direction and the Y-axis direction as an indexing feed direction by an electric slider or the like disposed below the chuck table 30.

An alignment unit 11 that detects a planned dividing line 902 of the wafer 90 which planned dividing line is to be subjected to laser processing is disposed above a movement path of the chuck table 30. The alignment unit 11 includes an unillustrated imaging unit which images the top surface 900 of the wafer 90. The alignment unit 11 can detect a laser processing planned dividing line 902 by image processing such as pattern matching, in reference to an image obtained by the unillustrated imaging unit. The image obtained by the unillustrated imaging unit is displayed on a monitor 113 illustrated in FIG. 1.

The laser irradiating unit 12, for example, has a cylindrical casing 120. The casing 120 horizontally extends in the Y-axis direction. An irradiating head 122 is disposed on a distal end portion of the casing 120. An unillustrated laser oscillator such as a yttrium aluminum garnet (YAG) pulsed laser, for example, is disposed in the casing 120. A laser beam emitted horizontally in a +Y direction from the unillustrated laser oscillator is reflected in a −Z direction by an unillustrated mirror, is made incident on a condensing lens in the irradiating head 122, and is condensed and applied to the wafer 90 held under suction by the chuck table 30. The height position of a condensing point of the laser beam can be adjusted in the Z-axis direction by unillustrated condensing point position adjusting means.

The laser processing apparatus 1 includes, for example, a radiation type light source 60 that irradiates the wafer 90 with light. The light source 60 is, for example, a white light source that can apply light in a wide wavelength range (ultraviolet, visible, and near-infrared light). The light source 60 illustrated in FIG. 1 and FIG. 3, which light source is made to be a white light source in order to save the trouble of changing the light source according to measurement contents, is disposed above the coating table 700 of the protective film forming unit 70. The light source 60 is configured to irradiate the top surface 900 of the wafer 90 of the frame unit 9 held under suction by the coating table 700 obliquely from above. A condensing lens 603 that adjusts the focus of emitted light that is emitted from the light source 60 and that includes light of a wavelength absorbed by a light absorbing material included in a protective film 92 is disposed on an optical path of the emitted light. Incidentally, a light source that applies single wavelength light of a lamp of halogen, tungsten, mercury, or the like may be used as the light source 60.

Further, in the present embodiment, a first filter 61 that transmits only light of a specific wavelength (for example, light of a wavelength of 435 nm or light of a wavelength of 365 nm) is disposed between the light source 60 and the wafer 90 held under suction by the coating table 700. Specifically, the first filter 61 includes a wheel rotation type filter changer. A plurality of filter members arranged circumferentially and attached to filter rings of the filter changer are rotated and selected. It is thereby possible to change a filter member located on an optical path to, for example, a filter member that transmits light of a wavelength of 435 nm or a filter that transmits light of a wavelength of 365 nm.

Provided at a position above the coating table 700 on an opposite side of the center of the coating table 700 from the light source 60 is, for example, a measuring unit 69 that measures a first reflection intensity by receiving reflected light reflected from the top surface 900 by the particularly necessary patterns 909 formed on the top surface 900 and located at respective X-axis and Y-axis coordinate positions (see FIG. 2, but not illustrated in FIG. 3) when the top surface 900 of the wafer 90 is irradiated with light. Further arranged on an optical path of the light from the top surface 900 of the wafer 90 to the measuring unit 69 are, for example, a second filter 68 that transmits only light of a specific wavelength (for example, light of a wavelength of 435 nm in a post-protective film formation measuring step to be described later) and a condensing lens 67 that condenses the light passed through the second filter 68 to a light receiving surface of the measuring unit 69. Incidentally, the second filter 68 may be of a configuration including a filter changer as in the first filter 61.

Incidentally, the condensing lens 603 and the condensing lens 67 are formed by a single lens or a combination lens. In addition, the condensing lens 603 may, for example, be configured to be drivable in an optical axis direction to allow adjustment of the focal point and condensing diameter of the measurement light.

The measuring unit 69 in the present embodiment can function as an imaging unit, for example. Specifically, the measuring unit 69 functioning as the imaging unit may, for example, be an area sensor camera having an imaging region capable of imaging the whole of the top surface 900 of the wafer 90 held under suction by the coating table 700 or an area sensor camera having an imaging region capable of imaging substantially ¼ of the top surface 900 of the wafer 90. However, the measuring unit 69 may, for example, be a line sensor camera, and include an imaging unit that outputs image information after photoelectrically converting a subject image formed by the reflected light from the top surface 900 of the wafer 90 to the measuring unit 69 through an optical system including the second filter 68 and the condensing lens 67 or the like.

The imaging unit of the measuring unit 69 is formed by, for example, linearly arranging a plurality of light receiving elements such as charge coupled devices (CCDs). The length in the longitudinal direction of the imaging unit is equal to or more than the radius of the wafer 90. The imaging unit thus has an imaging region having a length equal to or more than the radius of the wafer 90. In a pre-protective film formation measuring step to be described later, the measuring unit 69, for example, sequentially transmits, to a control unit 19 illustrated in FIG. 1, captured images in a line shape which are sequentially obtained as the coating table 700 holding under suction the wafer 90 is rotated. The captured images are recorded in order on a storage medium of the control unit 19, to be able to constitute a captured image depicting the whole of the top surface 900 of the wafer 90. Then, when the coating table 700 is completely rotated by 360 degrees, for example, the control unit 19 displays the captured image depicting the whole of the top surface 900 of the wafer 90 on the monitor 113 illustrated in FIG. 1. Incidentally, a captured image substantially similar to that of the above-described line sensor camera can be obtained even in a case where the measuring unit 69 functioning as the imaging unit is an area sensor camera having an imaging region capable of imaging ¼ of the top surface 900 of the wafer 90.

Incidentally, the measuring unit 69 may not function as the imaging unit, but may be configured to include a line sensor as described above as a light receiving unit, and to be able to measure the first reflection intensity on the whole of the top surface 900 of the wafer 90 (that is, at each X-axis and Y-axis coordinate position) in the pre-protective film formation measuring step, for example, when the coating table 700 holding under suction the wafer 90 is rotated by 360 degrees. In this case, received light amounts received by the line sensor differ according to the respective first reflection intensities of respective regions in the X-axis and Y-axis plane of the top surface 900 of the wafer 90. The measuring unit 69 converts the different received light amounts into voltage signals, for example, and transmits the voltage signals to the control unit 19 illustrated in FIG. 1.

As illustrated in FIG. 1, the laser processing apparatus 1 includes the control unit 19 that controls the whole of the apparatus. The control unit 19 includes a central processing unit (CPU) for performing arithmetic processing according to a control program, a storage medium such as a memory, and the like. The control unit 19 is electrically connected to the rotating unit 702 for rotating the coating table 700 of the protective film forming unit 70, the moving mechanism 173 of the first transporting unit 17, and the like via an unillustrated wired or wireless communication path. The movement control of the first transporting unit 17 holding under suction the wafer 90, the rotation control of the wafer 90 held under suction by the coating table 700, and the like are performed under control of the control unit 19. In addition, the storage medium of the control unit 19 stores a correlation graph G illustrated in FIG. 4, the correlation graph G indicating correlation data regarding the correlation between the fluorescence intensity of the protective film and the thickness of the protective film, the correlation data being obtained in advance.

Specifically, in a case where the motor as a rotational driving source constituting the rotating unit 702 of the protective film forming unit 70 is a servomotor, for example, a rotary encoder of the servomotor is connected to the control unit 19 also having a function as a servo amplifier, and after an operating signal is supplied from an output interface of the control unit 19 to the servomotor, the rotary encoder outputs the number of rotations of the servomotor as an encoder signal to an input interface of the control unit 19. Then, receiving the encoder signal, the control unit 19 successively recognizes the rotational angle of the coating table 700 in reference to the rotational angle of the servomotor. It is thus possible to successively recognize the direction of the planned dividing lines 902 of the wafer 90 held under suction by the coating table 700, the direction of the wafer 90 in the X-axis and Y-axis plane, and the like.

In the following, description will be made of operation of each configuration of the laser processing apparatus 1 and each step of a protective film thickness measuring method according to the present invention for measuring the thickness of the protective film formed on the top surface 900 of the wafer 90, which is performed in the laser processing apparatus 1, in a case where the laser processing apparatus 1 illustrated in FIG. 1 performs laser processing on the wafer 90.

(Unloading of Frame Unit from Cassette and Loading Frame Unit onto Coating Table)

First, the cassette 14 housing a plurality of frame units 9 as illustrated in FIG. 1 is mounted on the cassette mounting base 13, and thereafter, the height of the cassette 14 is adjusted by the raising and lowering elevator. Next, the push-pull 15 advances into the cassette 14 by moving in the +Y direction, and grasps the annular frame 94 of a frame unit 9 mounted on a target shelf. The push-pull 15 extracts one frame unit 9 from the cassette 14, and mounts the annular frame 94 thereof onto the centering guide 16, where the centering (detection of the central position) of the frame unit 9 is performed.

The moving mechanism 173 of the first transporting unit 17 positions the holding pad 171 above the annular frame 94 on the centering guide 16, and the center of the holding pad 171 and the center of the frame unit 9 are set in a state of substantially coinciding with each other. Further, the holding pad 171 is lowered, and the four suction disks 176 come into contact with the upper surface of the annular frame 94, and suck the upper surface of the annular frame 94.

The holding pad 171 holding the frame unit 9 illustrated in FIG. 1 is swung and positioned above the coating table 700 of the protective film forming unit 70, and the holding pad 171 is lowered to mount the frame unit 9 on the holding surface of the coating table 700. The coating table 700 holds under suction the wafer 90 on the flat holding surface with the top surface 900 oriented upward. In addition, the sandwiching clamps 705 sandwich and fix the annular frame 94 from which the holding pad 171 is separated.

(1) Pre-Protective Film Formation Measuring Step

Figure 3:
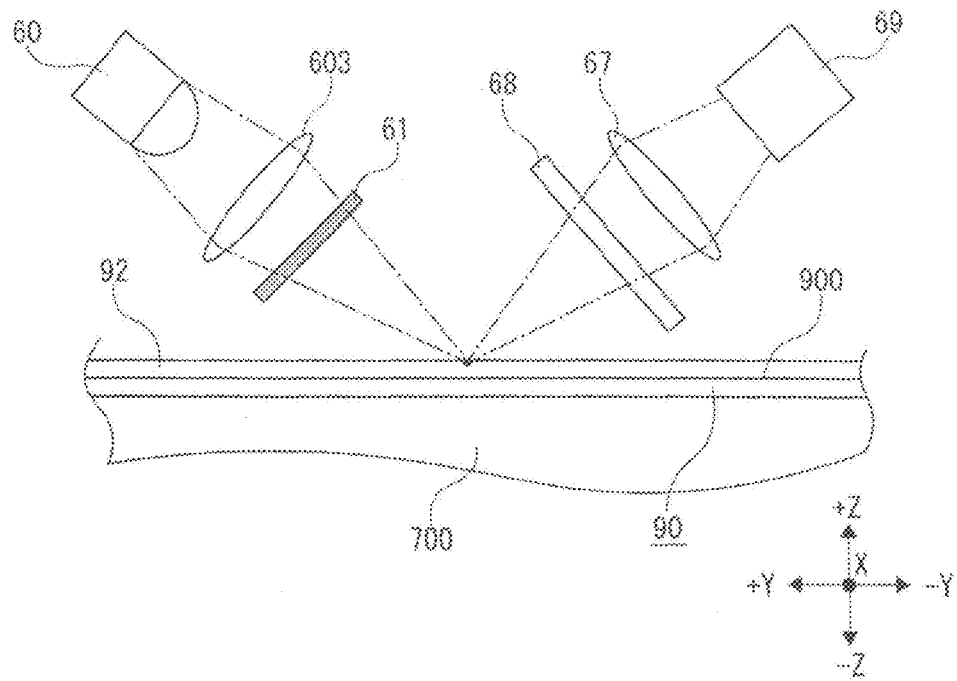
FIG. 3 is a schematic diagram illustrating an arrangement of a light source, a first filter, a second filter, and a measuring unit used in a pre-protective film formation measuring step and a post-protective film formation measuring step.

The protective film thickness measuring method according to the present invention first performs a pre-protective film formation measuring step of irradiating, with light, the top surface 900 of the wafer 90 in a state in which the protective film is not formed, and measuring a first reflection intensity from the top surface 900 (that is, the first reflection intensity from each X-axis and Y-axis coordinate position of the top surface 900). In the pre-protective film formation measuring step, first, the measurement light emitted from the light source 60 illustrated in FIG. 3 is condensed by the condensing lens 603, and is then transmitted through the first filter 61. The wavelength of the measurement light transmitted through the first filter 61 is 435 nm, for example. The measurement light is made incident on the top surface 900 of the wafer 90 illustrated in FIG. 1. The wavelength of the measurement light made incident on the top surface 900 of the wafer 90 is set to be a single wavelength of 435 nm because the fluorescence of the protective film in a post-protective film formation measuring step to be described later is set to be 435 nm, for example, and the wavelength of the measurement light is made to coincide with this.

Reflected light of the wavelength of 435 nm from the top surface 900 of the wafer 90 illustrated in FIG. 1 and FIG. 2, that is, from the patterns 909 formed at the respective X-axis and Y-axis coordinate positions of the top surface 900, is transmitted through the second filter 68 set in advance to transmit only light of the wavelength of 435 nm. The reflected light is captured by the condensing lens 67. The reflected light is then made incident on the imaging unit constituted by the light receiving elements of the measuring unit 69 functioning as an imaging unit in the present embodiment. When the coating table 700 illustrated in FIG. 1, for example, is completely rotated by 360 degrees by the rotating unit 702 as described earlier while the measurement light of the wavelength of 435 nm is thus made incident on the top surface 900 of the wafer 90, the control unit 19 can form a captured image depicting the whole of the top surface 900 of the wafer 90. Incidentally, while the measuring unit that can function as an imaging unit is a monochrome camera in the present embodiment, the measuring unit may be a color camera.

An intensity measuring unit 193 of the control unit 19 illustrated in FIG. 1 executes a program for measuring the first reflection intensity from the formed captured image. The captured image is, for example, an aggregate of pixels of a predetermined size, the luminance values of the pixels being represented by 8-bit gray levels, that is, 256 gray levels of 0 to 255. As the luminance value of one pixel becomes close to zero, the pixel does not have brightness and approaches black. In addition, as the luminance value becomes close to 255, the pixel has brightness and approaches white. As the luminance value in each pixel of the formed captured image, that is, the light amount of the reflected light made incident on each pixel of the CCD of the imaging unit of the measuring unit 69, is decreased, the luminance value of the pixel approaches zero, the pixel approaches a black color, and the first reflection intensity becomes a small value.

Incidentally, in a case where the wafers 90 of the plurality of frame units 9 housed in a shelf form in the cassette 14 are wafers of the same lot, the pre-protective film formation measuring step is performed only for the wafer 90 (first wafer 90) of a frame unit 9 to be processed first, and the intensity measuring unit 193 generates a first reflection intensity data table in which respective X-axis and Y-axis coordinate positions in an X-axis and Y-axis plane coordinate system parallel with the top surface 900 of the wafer 90 in the captured image are associated with first reflection intensities measured at the respective X-axis and Y-axis coordinate positions. Then, when second and subsequent frame units 9 are processed, the first reflection intensity data table is used, so that the pre-protective film formation measuring step does not need to be performed. This first reflection intensity data table is stored on the storage medium of the control unit 19 to be used in the post-protective film formation measuring step to be described later.

Incidentally, the X-axis and Y-axis coordinate positions of the top surface 900 of the wafer 90 of the above-described frame unit 9 on the coating table 700 can, in principle, be identified at all times together with the rotational angle of the coating table 700 while the center of the holding surface of the coating table 700 which center can be identified by the control unit 19 at all times is set as a reference, because the frame unit 9 is centered by the centering guide 16 and is then held under suction in a state in which the center of the frame unit 9 is made to substantially coincide with that of the coating table 700 by the first transporting unit 17 whose movement is controlled by the control unit 19. Incidentally, when a notch or an orientation flat is formed in the wafer 90, these may be used to recognize each X-axis and Y-axis coordinate position of the top surface 900 of the wafer 90 in the captured image.

In addition, when a second or subsequent frame unit 9 is held on the coating table 700 in a case where the second and subsequent frame units 9 including wafers 90 of the same lot (kind) as the first one are to be processed, the orientation of second wafer 90 may deviate from the orientation of the first wafer 90 on the coating table 700 at the time when the above-described first reflection intensity data table is formed. In this case, in the pre-protective film formation measuring step, after the measuring unit 69 forms a captured image depicting the top surface 900 of the second wafer 90, pattern matching using the patterns 909 formed on the wafer 90 and/or matching using a notch or an orientation flat in a case where either of them are formed in the wafer 90 are (is) performed by using the captured image of the wafer 90 of the first frame unit 9 and the captured image of the wafer 90 of the second frame unit 9. A deviation amount (an amount of deviation in an X-axis and Y-axis coordinate system or an θ deviation amount) is thereby recognized, and a correction value based on the deviation amount is obtained.

Thereafter, the post-protective film formation measuring step or the like to be described later may be performed after the deviation is corrected by adding the correction value for the above-described deviation to the first reflection intensity data table that associates each X-axis and Y-axis coordinate position of the wafer 90 on the above-described coating table 700 and each first reflection intensity with each other, the first reflection intensity data table being generated in the pre-protective film formation measuring step for the first frame unit 9.

Incidentally, the pre-protective film formation measuring step is performed each time the lot (kind) of the wafers 90 to be processed is changed. This is because material properties and the configuration of the patterns 909 differ according to the kind of the wafers 90, and the first reflection intensities are hence changed.

(2) Protective Film Forming Step

After the completion of the pre-protective film formation measuring step, a protective film including a light absorbing material is next formed on the top surface 900 of the wafer 90 held under suction by the coating table 700 illustrated in FIG. 1. Specifically, the protective film forming step is performed by spin coating in which the protective film agent applying nozzle 704 that communicates with an unillustrated protective film agent supply source and drops and jets a protective film agent in a liquid state downward is positioned above the center of the wafer 90, and drops a predetermined amount of the protective film agent onto the center of the top surface 900, and thereafter the frame unit 9 is rotated together with the coating table 700. The dropping of the protective film agent is ended when the protective film agent is applied to the whole of the top surface 900 by a centrifugal force of the rotation of the coating table 700 and a predetermined amount of the protective film agent is applied. After the predetermined amount of the protective film agent is applied to the top surface 900 of the wafer 90, the protective film agent is dried and solidified by rotation of the coating table 700, and the protective film 92 illustrated in FIG. 3 is formed to have a desired thickness.

Incidentally, for example, the protective film agent may be applied to spread over the whole of the top surface 900 of the wafer 90 of the frame unit 9 rotated by the coating table 700, by swinging the protective film agent applying nozzle 704 such that the protective film agent applying nozzle 704 reciprocates above the wafer 90 at a predetermined angle to pass above the center of the wafer 90. The protective film 92 covering the whole of the top surface 900 may thus be formed. The formed protective film 92 prevents debris generated in the laser processing from adhering to the top surface 900 of the wafer 90.

Examples of the protective film agent in a liquid state include, for example, polyvinyl alcohol, polyvinylpyrrolidone, polyethylene glycol with five or more ethyleneoxy repeating units, polyethylene oxide, methyl cellulose, ethyl cellulose, hydroxypropyl cellulose, polyacrylic acid, a polyvinyl alcohol-polyacrylic acid block copolymer, a polyvinyl alcohol-polyacrylic acid ester block copolymer, polyglycerin, and the like. These can be used singly as one kind, or two kinds or more can be used in combination. The protective film agent in the present embodiment is, for example, a water-soluble protective film agent having the product name of HogoMax manufactured by DISCO Corporation.

The protective film agent in a liquid state includes a light absorbing material that absorbs light in a predetermined wavelength range (for example, a wavelength range of 250 to 450 nm both inclusive). A benzophenone-based, benzotriazole-based, triazine-based, or benzoate-based plastic additive or the like, for example, is used as the light absorbing material. Incidentally, the light absorbing material, for example, absorbs light of the wavelength of the laser beam when the laser processing of the wafer 90 is performed.

(3) Post-Protective Film Formation Measuring Step

As illustrated in FIG. 3, after the protective film 92 is formed on the top surface 900 of the wafer 90, performed is a post-protective film formation measuring step which irradiates the protective film 92 with exciting light of a wavelength at which the light absorbing material fluoresces, and which measures, by the measuring unit 69, a second reflection intensity including the fluorescence of the protective film 92 and reflected light reflected from the patterns 909 when the fluorescence of the protective film 92 is made incident on the patterns 909 (see FIG. 2) formed on the top surface 900 of the wafer 90.

First, for example, the coating table 700 is rotated by a predetermined angle and stopped under control of the rotating unit 702 by the control unit 19 illustrated in FIG. 1 such that the orientation in the X-axis and Y-axis plane of the wafer 90 at a time of formation of the captured image in the pre-protective film formation measuring step and the orientation of the wafer 90 after the formation of the protective film 92 coincide with each other.

After the exciting light emitted from the light source 60 is condensed by the condensing lens 603, the exciting light passes through the first filter 61 in which the filter changer has changed the filter member to a filter member (filter member that transmits light of a wavelength of 365 nm) different from a filter member used in the pre-protective film formation measuring step, for example. The exciting light that has transmitted through the first filter 61 is, for example, continuous light of a single wavelength of 365 nm. The exciting light is made incident on the protective film 92 formed on the top surface 900 of the wafer 90. Incidentally, though depending on the kind of the light absorbing material included in the protective film 92, the exciting light is continuous light for suppressing alteration of the protective film 92. In addition, it is preferable to use light of a wavelength at which the fluorescence intensity of the protective film 92 becomes highest.

When the applied exciting light is absorbed by the light absorbing material of the protective film 92, the light absorbing material in a ground state is excited, and is set in an unstable state of high molecular energy. After the light absorbing material falls into a relaxed electron singlet state, the light absorbing material releases energy and returns to the ground state while emitting light of a wavelength (for example, light of the wavelength of 435 nm) longer than that of the exciting light emitted from the light source 60. The light emitted at a time of returning to the ground state is fluorescence. The fluorescence of the wavelength of 435 nm passes through the second filter 68 illustrated in FIG. 3 set in advance to transmit only light of the wavelength of 435 nm, is captured by the condensing lens 67, and is made incident on the imaging unit constituted by the light receiving elements of the measuring unit 69 functioning as an imaging unit in the present embodiment. Incidentally, the exciting light of the wavelength of 365 nm from the light source 60 is interrupted by the second filter 68, and is hence not made incident on the imaging unit of the measuring unit 69.

Because the patterns 909 (see FIG. 2) are formed on the top surface 900 of the wafer 90, the reflected light of the wavelength of 435 nm which is reflected by the patterns 909 when the fluorescence of the protective film 92 is made incident on the patterns 909 passes through the second filter 68, is captured by the condensing lens 67, and is made incident on the imaging unit constituted by the light receiving elements of the measuring unit 69.

Figure 5:
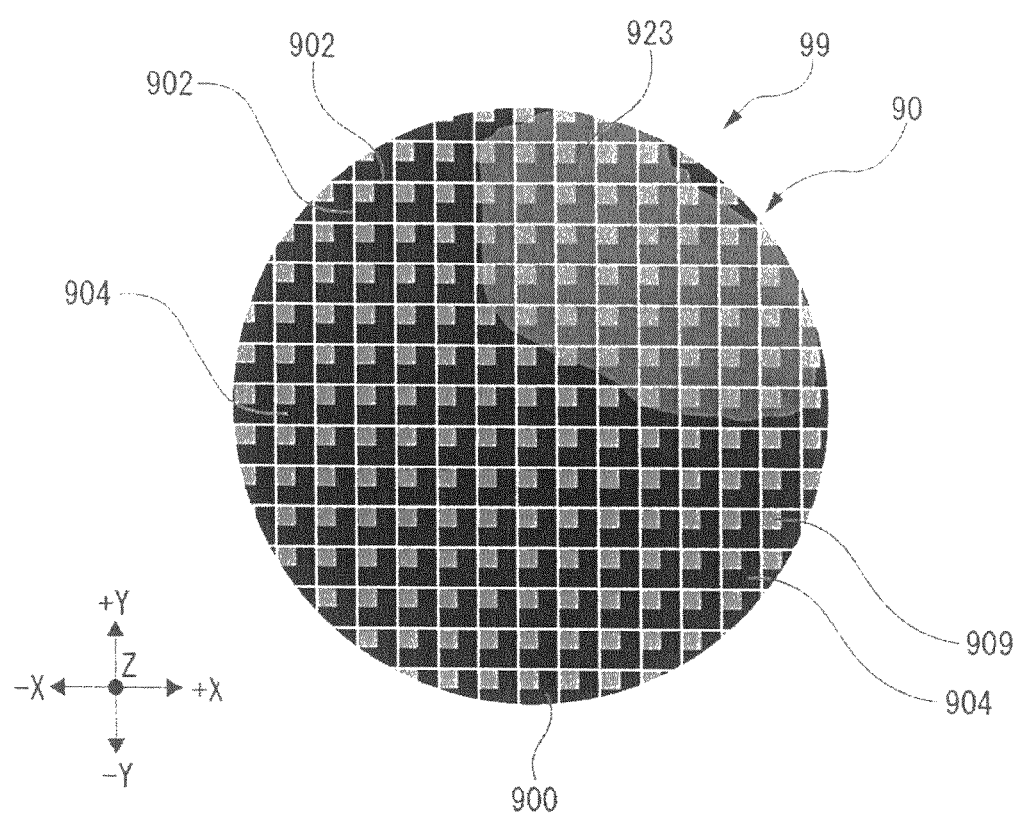
FIG. 5 is a diagram of assistance in explaining a captured image formed by the measuring unit that functions as an imaging unit in the post-protective film formation measuring step, the captured image indicating second reflection intensity including the fluorescence of the protective film and reflected light reflected by patterns formed on the top surface of the wafer when the fluorescence of the protective film is made incident on the patterns and thinness/thickness of each region of the protective film.

When the coating table 700, for example, is completely rotated by 360 degrees by the rotating unit 702 as described earlier while the exciting light of the wavelength of 365 nm is thus made incident on the protective film 92 formed on the top surface 900 of the wafer 90, the measuring unit 69 can form a captured image 99 illustrated in FIG. 5, which image depicts the whole of the top surface of the protective film 92 of the wafer 90.

The intensity measuring unit 193 of the control unit 19 illustrated in FIG. 1 executes a program for measuring, from the captured image 99 formed in the present step, a second reflection intensity including the fluorescence of the protective film 92 and the reflected light reflected by the patterns 909 after being made incident on the patterns 909 formed on the top surface 900. First, in the captured image 99, the second reflection intensity increases in proportion to the magnitude of the thickness of the protective film 92 (see FIG. 3) formed on the top surface 900 of the wafer 90. This is because the amount of the light absorbing material included in the protective film 92 increases when the thickness of the protective film 92 is increased.

The intensity measuring unit 193 illustrated in FIG. 1 generates a second reflection intensity data table in which the X-axis and Y-axis coordinate positions of the protective film 92 formed on the top surface 900 of the wafer 90 in the captured image 99 are associated with respective second reflection intensities (pixel luminance) measured at the respective X-axis and Y-axis coordinate positions. The second reflection intensity data table generated from the captured image 99 at this time point is generated when the reflected light of the wavelength of 435 nm which is reflected by the patterns 909 when the fluorescence of the protective film 92 is made incident on the patterns 909 present at the respective X-axis and Y-axis coordinate positions of the top surface 900 is also made incident on the imaging unit of the measuring unit 69 illustrated in FIG. 3. Thus, the film thickness of the protective film 92 cannot be measured accurately. Incidentally, in FIG. 5, a thick region 923 of the protective film 92 illustrated in FIG. 3 on the top surface 900 of the wafer 90 is indicated by a white filter (haze) being applied.

(4) Protective Film Fluorescence Intensity Calculating Step

AS such, performed is a protective film fluorescence intensity calculating step which excludes the reflection intensities of the patterns 909 formed on the top surface 900, by removing the first reflection intensities measured in the pre-protective film formation measuring step from the second reflection intensities measured in the post-protective film formation measuring step, and calculates the fluorescence intensities of the protective film 92.

The control unit 19 illustrated in FIG. 1 includes a calculating section 198 that executes a protective film fluorescence intensity calculating program. The calculating section 198 removes the first reflection intensities measured in the pre-protective film formation measuring step from the second reflection intensities measured in the post-protective film formation measuring step, by using the captured image 99 illustrated in FIG. 5. Specifically, formed is a post-removal captured image 997 illustrated in FIG. 6 which is obtained by removing, from the respective second reflection intensities measured at the respective X-axis and Y-axis coordinate positions in the captured image 99, the respective first reflection intensities at the corresponding respective X-axis and Y-axis coordinate positions. The post-removal captured image 997 depicts only the fluorescence intensities of the protective film (see FIG. 3). Thus, the calculating section 198 respectively calculates/stores the fluorescence intensities of the protective film 92 at the respective coordinate positions in an X-axis and Y-axis coordinate plane of the entire top surface of the protective film 92.

(4) Protective Film Thickness Identifying Step

Figure 4:
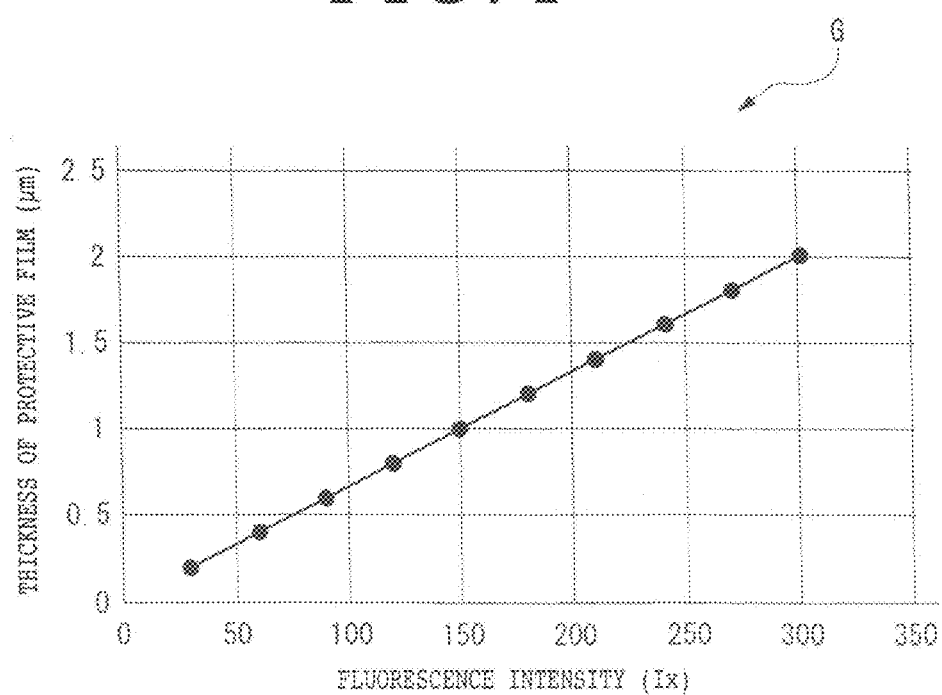
FIG. 4 is a graph illustrating correlation between the fluorescence intensity of a protective film and the thickness of the protective film, the correlation being obtained in advance.
Figure 6:
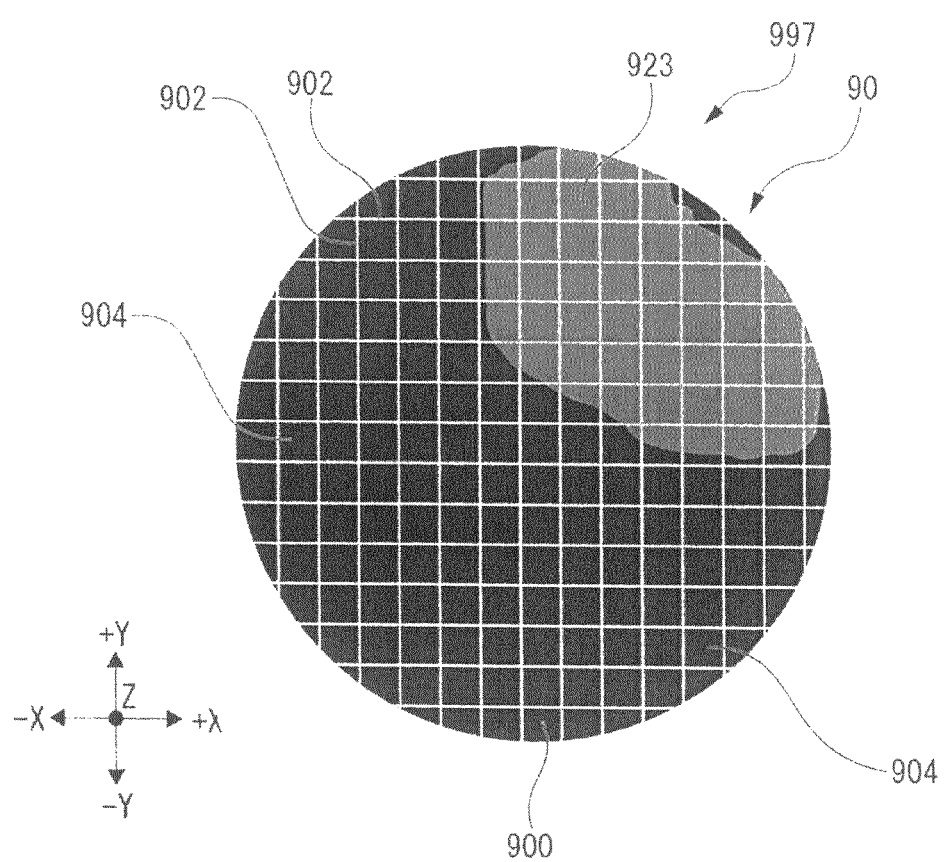
FIG. 6 is a diagram of assistance in explaining a state in which first reflection intensity is removed from the second reflection intensity by using, in a protective film fluorescence intensity calculating step, the captured image formed by the measuring unit functioning as an imaging unit in the post-protective film formation measuring step, and the reflection intensity of the patterns formed on the top surface of the wafer is thereby excluded.

Next, the calculating section 198 illustrated in FIG. 1, for example, identifies respective thicknesses at the X-axis and Y-axis coordinate positions of the protective film 92 formed on the top surface 900 of the wafer 90, by using the correlation graph G illustrated in FIG. 4, the correlation graph G being input to and stored on a storage medium such as a memory in advance, and the fluorescence intensities of the protective film 92 which are calculated by using the post-removal captured image 997 illustrated in FIG. 6 in the protective film fluorescence intensity calculating step.

The correlation graph G illustrated in FIG. 4 is obtained by plotting correlation data regarding the correlation between the fluorescence intensity of the protective film (for example, the protective film of the same kind formed by HogoMax used in the present embodiment) and the thickness of the protective film, the correlation data being obtained in advance. In the correlation graph G, an axis of abscissas indicates the fluorescence intensity (unit: lx) of the protective film, and an axis of ordinates indicates the thickness (unit: μm) of the protective film. As indicated by the correlation graph G, in a case where the fluorescence intensity of the protective film is 150 lx, for example, the thickness of the protective film is 1 μm.

The above-described correlation graph G is, for example, obtained by an experiment performed in advance. Specifically, protective films similar to the protective film 92 formed on the wafer 90 this time (for example, the protective film formed by HogoMax) were formed with respective different thicknesses on, for example, a plurality of dummy wafers on which no patterns were formed. Then, accurate thicknesses of the respective protective films were measured by using a focused ion beam (FIB) measuring apparatus or the like, and the fluorescence intensities of the respective protective films were measured by irradiation of the protective films of the respective thicknesses with light of a predetermined wavelength (for example, a wavelength of 365 nm) from a light source. Incidentally, the light source used and the light source 60 actually included in the laser processing apparatus 1 (the white light source 60 in the present embodiment) preferably have the same specifications.

It is to be noted that, while data in a graph format is used as the correlation data regarding the correlation between the fluorescence intensity of the protective film and the thickness of the protective film, the correlation data being obtained in advance, there is no limitation to this configuration. The correlation data may, for example, be data in a table format which data indicates correspondence between the thickness of the protective film and the fluorescence intensity of the protective film.

Suppose, for example, that a desired thickness of the protective film 92 (see FIG. 3) formed on the top surface 900 of the wafer 90 illustrated in FIG. 6 is 1 μm. Then, in a region in the X-axis and Y-axis coordinate system to which a white filter is not applied on the top surface 900 of the wafer 90 in the post-removal captured image 997 of FIG. 6, the fluorescence intensities calculated in the protective film fluorescence intensity calculating step are, for example, 150 lx. The region is recognized as having the desired thickness of 1 μm from the correlation graph G illustrated in FIG. 4. In a region 923 to which a filter whiter than that applied to the region of the thickness of 1 μm is applied, the fluorescence intensities calculated in the protective film fluorescence intensity calculating step are, for example, 300 lx. The calculating section 198 recognizes the region 923 as having a thickness of 2 μm, which is 1 μm thicker than the desired thickness of 1 μm, from the correlation graph G illustrated in FIG. 4.

Incidentally, an allowed upper limit threshold value and an allowed lower limit threshold value, for example, are set in advance for the desired thickness of the protective film 92. When the thickness of the protective film 92 is equal to or more than the lower limit threshold value but equal to or less than the upper limit threshold value, the protective film 92 is determined to be within a predetermined range as a protective film of an appropriate thickness. When the thickness of the protective film 92 is smaller than the lower limit threshold value or when the thickness of the protective film 92 is larger than the upper limit threshold value, the protective film 92 is determined to be outside the predetermined range as a protective film that is too thick or too thin. In addition, when the area of the protective film 92 recognized as having a thickness outside the predetermined range as a protective film that is too thick or too thin is equal to or more than an allowed value, it may be determined that an inappropriate protective film 92 is formed on the top surface 900 of the wafer 90.

Incidentally, when it is determined in the protective film thickness identifying step that a protective film of an inappropriate thickness is formed on the top surface 900 of the wafer 90, the frame unit 9 illustrated in FIG. 1 is, for example, transported from the coating table 700 to the spinner table 740 of the cleaning unit 74 by the first transporting unit 17, and is held under suction by the spinner table 740. Further, the annular frame 94 is sandwiched and fixed by the sandwiching clamps 745. Then, for example, the cleaning nozzle 744 that communicates with an unillustrated cleaning water supply source and jets cleaning water downward is swung such that the cleaning nozzle 744 reciprocates above the wafer 90 at a predetermined angle to pass above the center of the wafer 90. The water-soluble protective film 92 of the inappropriate thickness of the frame unit 9 rotated by the spinner table 740 is thereby removed by cleaning. Thereafter, the protective film forming step and the subsequent steps described earlier are performed again.

(Laser Processing on Wafer on which Protective Film of Appropriate Thickness is Formed)

The frame unit 9 having the protective film 92 of an appropriate thickness formed on the top surface 900 of the wafer 90 is transported from the coating table 700 illustrated in FIG. 1 to the chuck table 30 by the second transporting unit 18. Then, the chuck table 30 holds under suction the wafer 90 on the flat holding surface in a state in which the protective film 92 is oriented upward, and the clamps 31 sandwich and fix the annular frame 94 from which the holding pad 181 is separated.

Next, the chuck table 30 is fed in a −X direction (forward direction), and the position of a planned dividing line 902 as a reference for applying the laser beam is detected by the alignment unit 11. Then, the chuck table 30 is indexing-fed in the Y-axis direction to align the planned dividing line 902 to be irradiated with the laser beam and the irradiating head 122 of the laser irradiating unit 12 with each other in the Y-axis direction.

Further, the height position of the condensing point of the laser beam condensed by the unillustrated condensing lens is, for example, set to the height position of the top surface 900 of the wafer 90. Then, the laser oscillator oscillates the laser beam of a wavelength absorbable by the wafer 90, and the laser beam is condensed and applied to the planned dividing line 902.

In addition, the wafer 90 is fed in the −X direction as the forward direction at a predetermined processing feed speed, and the laser beam is applied to the top surface 900 of the wafer 90 along the planned dividing line 902. The wafer 90 is thereby subjected to ablation from the top surface 900 to the undersurface 906, so that a processed groove that cuts the wafer 90, for example, is formed along the planned dividing line 902. Incidentally, the processed groove may be a half cut groove. Here, because the light absorbing material that absorbs light of the wavelength of the laser beam is added to the protective film 92, the protective film 92 is also removed from the planned dividing line 902 during the laser processing at the same time as the processing of the wafer 90. Therefore, the protective film 92 is prevented from being peeled off by the pressure of a vapor of a pyrolysate of the wafer 90 or the like, and while debris is generated on the planned dividing line 902 illustrated in FIG. 1, the protective film 92 prevents debris from adhering to the surfaces of the devices 904.

The application of the laser beam is stopped when the wafer 90 is advanced in the −X direction along the planned dividing line 902 to a predetermined position at which the application of the laser beam is to be ended. Further, the chuck table 30 is indexing-fed in the Y-axis direction by a predetermined distance, and a point immediately below the condensing point of the irradiating head 122 is positioned on the next target planned dividing line 902. Then, the wafer 90 is processing-fed in a +X direction as a return direction, and as in the laser beam irradiation in the forward direction, the wafer 90 is subjected to laser processing along the planned dividing line 902. Then, similar laser processing is sequentially performed while the chuck table 30 is indexing-fed in the Y-axis direction at intervals of the planned dividing lines 902 adjacent to each other. The wafer 90 is thereby cut along all of the planned dividing lines 902 extending in the X-axis direction.

Further, the chuck table 30 is rotated by 90 degrees, and similar laser processing is performed. Consequently, all of the planned dividing lines 902 are cut longitudinally and laterally, and the wafer 90 is divided into the devices 904.

Thereafter, the second transporting unit 18 transports the frame unit 9 in which the wafer 90 has been divided into the devices 904 from the chuck table 30 to the cleaning unit 74, where the protective film 92 is removed by cleaning. Further, the frame unit 9 after being cleaned is housed into the cassette 14 by the first transporting unit 17 and the push-pull 15.

As described above, the protective film thickness measuring method according to the present invention for measuring the thickness of the protective film 92 formed on the top surface 900 of the wafer 90 having the patterns 909 on the top surface 900 includes the pre-protective film formation measuring step of applying light to the top surface 900 of the wafer 90 in a state in which no protective film is formed and measuring the first reflection intensity of the light reflected from the top surface 900, the protective film forming step of forming the protective film 92 including the light absorbing material on the top surface 900, the post-protective film formation measuring step of irradiating the protective film 92 with the exciting light of a wavelength at which the light absorbing material fluoresces, and measuring the second reflection intensity including the fluorescence of the protective film 92 and the reflected light from the top surface 900 by the measuring unit 69, the protective film fluorescence intensity calculating step of excluding the reflection intensity of the patterns 909 formed on the top surface 900, by removing the first reflection intensity measured in the pre-protective film formation measuring step from the second reflection intensity measured in the post-protective film formation measuring step, and calculating the fluorescence intensity of the protective film 92, and the protective film thickness identifying step of identifying the thickness of the protective film 92 from the correlation data regarding the correlation between the fluorescence intensity of the protective film and the thickness of the protective film, the correlation data being obtained in advance, and the calculated fluorescence intensity of the protective film 92. It is thereby possible to accurately measure the thickness of the protective film 92 formed on the top surface 900 of the wafer 90 having the patterns 909 on the top surface 900.

In the protective film thickness measuring method according to the present invention, the measuring unit 69 can function as an imaging unit, the pre-protective film formation measuring step images the top surface 900 of the wafer 90 by the imaging unit, the post-protective film formation measuring step images the top surface of the protective film 92 formed on the top surface 900 of the wafer 90 by the imaging unit, and the first reflection intensity and the second reflection intensity are respectively measured in reference to luminance of pixels of respective images obtained by the imaging unit. It is thus possible to make a measurement time shorter than in the past.

In the protective film thickness measuring method according to the present invention, the light source 60 that irradiates the top surface 900 of the wafer 90 with light in the pre-protective film formation measuring step and the post-protective film formation measuring step is the white light source 60. The light source 60 can hence emit light of a plurality of wavelengths. In addition, the first filter 61 that transmits only light of a specific wavelength is disposed between the light source 60 and the wafer 90. It is thus possible to irradiate the protective film 92 with only light of a desired wavelength from the light to be applied (light of the plurality of wavelengths) according to the kind of the protective film or the light absorbing material or the like.

In the protective film thickness measuring method according to the present invention, the light source 60 that irradiates the top surface 900 of the wafer 90 with light in the pre-protective film formation measuring step and the post-protective film formation measuring step is the white light source 60, and the second filter 68 that transmits only light of a specific wavelength is disposed between the wafer 90 and the measuring unit 69. Thus, in the post-protective film formation measuring step, the irradiation light from the light source 60 is prevented from being made incident on the measuring unit 69.

It is needless to say that the protective film thickness measuring method according to the present invention is not limited to the foregoing embodiment, and may be carried out in various different forms within the scope of the technical concept of the present invention. In addition, each configuration or the like of the laser processing apparatus 1 used to perform the protective film thickness measuring method can also be modified as appropriate within a range in which effects of the present invention can be exerted.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective film thickness measuring method for measuring a thickness of a protective film formed on a top surface of a wafer having patterns on the top surface, the protective film thickness measuring method comprising:
    a pre-protective film formation measuring step of applying light of a first wavelength to the top surface of the wafer in a state in which no protective film is formed and measuring a first reflection intensity of the light reflected from the top surface;
    a protective film forming step of forming the protective film including a light absorbing material on the top surface;
    a post-protective film formation measuring step of irradiating the protective film with exciting light of a second wavelength at which the light absorbing material fluoresces, and measuring a second reflection intensity including fluorescence of the protective film and the light reflected from the top surface by a measuring unit, wherein the second wavelength is different from the first wavelength;
    a protective film fluorescence intensity calculating step of excluding reflection intensity of the patterns formed on the top surface, by subtracting the first reflection intensity measured in the pre-protective film formation measuring step from the second reflection intensity measured in the post-protective film formation measuring step, and calculating fluorescence intensity of the protective film; and
    a protective film thickness identifying step of identifying the thickness of the protective film from correlation data regarding correlation between the fluorescence intensity of the protective film and the thickness of the protective film, the correlation data being obtained in advance, and the calculated fluorescence intensity of the protective film.

2. The protective film thickness measuring method according to claim 1, wherein:
    the measuring unit is able to function as an imaging unit,
    the pre-protective film formation measuring step images the top surface of the wafer by the imaging unit,
    the post-protective film formation measuring step images a top surface of the protective film formed on the top surface of the wafer by the imaging unit, and
    the first reflection intensity and the second reflection intensity are respectively measured in reference to luminance of pixels of respective images obtained by the imaging unit.

3. The protective film thickness measuring method according to claim 1, wherein:
    a light source that irradiates the top surface of the wafer with light in the pre-protective film formation measuring step and the post-protective film formation measuring step is a white light source, and
    a first filter that transmits only light of a specific wavelength is disposed between the light source and the wafer.

4. The protective film thickness measuring method according to claim 3, wherein:
    the light source that irradiates the top surface of the wafer with light in the pre-protective film formation measuring step and the post-protective film formation measuring step is a white light source, and
    a second filter that transmits only light of a specific wavelength is disposed between the wafer and the measuring unit.

5. The protective film thickness measuring method according to claim 1, wherein the second wavelength is less than the first wavelength.

6. The protective film thickness measuring method according to claim 1, wherein:

the light used during the pre-protective film formation measuring step originates from a light source and is passed through a first filter that only transmits light of the first wavelength therethough; and the light used during the post-protective film formation measuring step originates from the light source and is passed through a second filter that only transmits light of the second wavelength therethough.

7. The protective film thickness measuring method according to claim 6, wherein the second wavelength is less than the first wavelength.

8. The protective film thickness measuring method according to claim 6, wherein the light source emits white light.

9. The protective film thickness measuring method according to claim 6, wherein the light source emits ultraviolet light of a wide wavelength range.

10. The protective film thickness measuring method according to claim 6, wherein the light source emits visible light of a wide wavelength range.

11. The protective film thickness measuring method according to claim 6, wherein the light source emits near-infrared light of a wide wavelength range.

* * * * *